(12) United States Patent
Pan

(10) Patent No.: US 6,348,823 B1
(45) Date of Patent: Feb. 19, 2002

(54) DIGITAL CONTROLLED OSCILLATING CIRCUIT OF DIGITAL PHASE LOCK LOOPS

(75) Inventor: Jian-Dai Pan, Hsinchu (TW)

(73) Assignee: Industrial Technology Research Institute (TW)

( * ) Notice: Subject to any disclaimer, the term of this patent is extended or adjusted under 35 U.S.C. 154(b) by 0 days.

(21) Appl. No.: 09/477,090

(22) Filed: Jan. 3, 2000

(30) Foreign Application Priority Data

Jun. 29, 1999 (TW) .......................................... 88110960

(51) Int. Cl.[7] ................................................ H03L 7/06
(52) U.S. Cl. ........................ 327/159; 327/158; 327/149; 327/150
(58) Field of Search ................................ 327/1, 2, 3, 7, 327/12, 149, 153, 156, 158, 161, 150

(56) References Cited

U.S. PATENT DOCUMENTS 5,774,511 A * 9/1998 Boerstler .................... 375/376
5,974,105 A * 10/1999 Wang et al. ................. 375/376
6,005,443 A * 12/1999 Damgaard et al. ............ 331/14
6,052,034 A * 4/2000 Wang et al. .................... 331/2
6,115,442 A * 9/2000 Wu et al. ...................... 377/47

* cited by examiner

*Primary Examiner*—Terry D. Cunningham
*Assistant Examiner*—Quan Tra
(74) *Attorney, Agent, or Firm*—Morgan & Finnegan, LLP

(57) ABSTRACT

A digital controlled oscillator (DCO) of a digital phase lock loop (PLL) is disclosed, wherein a fractional DCO structure is employed to provide the required target clock for comparing with the generated output clock. Comparison results of phase differences then enable a K-counter loop filter for changing its stored value. A control logic circuit is enabled to control a tapped-delay line for adjusting the currently output 'clock to coincide the requirement of the target clock when the stored value increases/decreases to K/−K. Additionally, signals from all-digital counter filter can be input to the fractional DCO structure to calibrate the frequency of the target clock according to environment without additional circuits.

16 Claims, 15 Drawing Sheets

DIGITAL CONTROLLED OSCILLATING CIRCUIT OF DIGITAL PHASE LOCK LOOPS

BACKGROUND OF THE INVENTION

1. Field of the Invention

The present invention relates generally to a digital phase lock loop, and ore particularly, to a digital phase lock loop that generating output clock having wider frequency ranges than conventional approaches and no delay lookup circuit is required.

2. Description of the Prior Art

Phase lock loops (PLL) have been widely used in communication systems or the like, some frequently appeared applications such as extracting information from carried waves or synchronous signals usually employ PLLs to achieve their requirements. Typically, PLLs can be classified into analog- or digital-type PLL circuits. FIG. 1 represents a schematic diagram of a conventional analog PLL, which basically consists of a phase detector 102, a loop filter 104, and a voltage controlled oscillator (VCO) 106. Input signal $S_{ia}$ and the signal $S_{oa}$ output by the VCO 106 are together routed to the phase detector 102 for comparing their phases. An output voltage $V_{PD}$ according to the aforementioned comparison result is processed by the loop filter 104 to eliminate high frequency noises. A voltage $V_{LF}$ then outputs to VCO 106 for adjusting the currently oscillating frequency such that the phase deviation between $S_{ia}$ and $S_{oa}$ can be minimized. Typically, a low pass filter is usually used to construct the loop filter 104 because the high frequency signals will be removed in PLLs. However, analog circuits are very expensive because the loop filter 104 and VCO 106 are usually composed of resistance and capacitors conventionally, which also indicates that large spaces are occupied and required simultaneously. Nowadays, the advent of digital circuit technology brings the PLLs to be established by digital circuits such as flip-flops or logical gates (e.g., AND, OR, NOR, exclusive OR gates, and so on).

Please refer to FIG. 2, which shows a functional diagram representative of a conventionally digital PLL that includes an all-digital phase detector 202, an all-digital loop filter 204, a divider (DIV) 206, a digitally controlled oscillator (DCO) 208, and a fixed high frequency oscillator 210. In operations, the input reference clock $S_{id}$ will be compared with the output clock of DIV 206 in all-digital phase detector 202 to obtain their phase differences. The comparison result is then processed by all-digital loop filter 204 to generate a control signal suitable for DCO 208. The DCO 208, which requires a reference clock generated by a fixed high frequency oscillator 210, outputs a locked signal $S_{od}$ routed to DIV 206 for further processing instead of routed to all-digital phase detector 202 directly. DIV 206 that typically a programmable divider then divides the frequency of the reference clock provided from the fixed high frequency oscillator 210 before transferring to all-digital phase detector 202. The fixed high frequency oscillator 210 is practically a crystal oscillator having a high oscillating frequency, which is usually provided for generating a reference clock for the system it mounted therein. In the present days, DCO 208 described above is broadly employed in digital PLLs to replace the use of VCO 106 in analog PLLs, many schematics for DCO 208 are thus disclosed today. Descriptions of some structures associated with the invention are given hereinafter.

Please refer to FIG. 3A, which depicts a schematic diagram composed of fractional structure to generate the desired clock by dividing reference clock having high frequency conventionally. A waveform diagram generated by the structure of FIG. 3A is depicted in FIG. 3B. A clock CK_OSC generated by a fixed high frequency oscillator 302 is used as the base for generating an output clock $S_{OF}$ by the cooperation of a divider (DIV) 304, a fractional part set 306, and a selector 308. In operations, the relation between the frequency $F_{CK\_OSC}$ of CK_OSC and the frequency $F_{CK\_DCO}$ of the target clock can be described as:

$$F_{CK\_DCO} \times N \frac{A}{M} = F_{CK\_OSC}$$

where A and M are internally controlled parameters of the fractional structure. For example, when $F_{CK\_OSC}$ and $F_{CK\_DCO}$ are respectively 32 and 13 MHz, the above equation will be:

$$F_{CK\_DCO} \times N \frac{A}{M} = F_{CK\_OSC} = 32 = 13 \times 2 \frac{6}{13}$$

Thus, A, M and N are 6, 13, and 2, respectively. In operations, the fractional part set 306 generates a comparison result $S_D$ to decide the frequency next output through $S_{OF}$ by using parameters A and M when triggered by $S_{OF}$. For example, when M and $F_{CK\_OSC}$ are respectively 13 and 32 MHz, a clock having an average frequency of 13 MHz can be derived by using clocks of 16 and 10.67 MHz because 13 falls in a range of 16 MHz(32/2) to 10.67 MHz(32/3). At the beginning, a clock having a frequency equal to a half of $F_{CK\_OSC}$ (i.e., 16=32/N, N=2) can be output as $S_{OF}$ because A (6) is smaller than M (13). At the second period, the clock having a frequency equal to a half of $F_{CK\_OSC}$ is still output as $S_{OF}$ because A plus itself (i.e., A=6) to obtain 12 which is also smaller than M (13). Next at the third period, due to the added value becomes 18 (12+6) is larger than M, the fractional part set 306 outputs an overflow signal to force the selector 308 to output a clock having a frequency of 10.67 (32/(2+1)) MHz as $S_{OF}$. Additionally, control signals from the loop filter 204 can adjust the frequency of $S_{OF}$, for example, a carry signal or a borrow signal can slow down or speed up the output clock $S_{OF}$, respectively.

A very simple structure is obviously offered by FIG. 3A to generate a clock having an average frequency equal to the target clock. Accordingly, the manufacture cost can be significantly degraded based on fractional structure, and furthermore the duty cycle of the generated clock is 100%. However, the output jitter generated by the fractional structure usually too large to make the systems abnormally perform. Please refer to FIG. 3B again, the output jitter will be larger when the frequencies of the target clock and $F_{CK\_OSC}$ are getting closer because the frequency of $S_{OF}$ switches at ($F_{CK\_OSC} \times 1/N$) and ($F_{CK\_OSC} \times 1/(N+1)$). For example, $S_{OF}$ will varies from 10.67 to 16 MHz when N=2. However, $S_{OF}$ will varies from 16 to 32 MHz when N=1, and the output jitter will be:

$1/N-1(N+1)=1/1-1/2=1/2 UI$(Unit Interval)

which is usually out of the current jitter specification (e.g., 1/8 or 1/6 UI). On the other hand, the period of the clock generated by the fractional structure is unstable although its average frequency coincide the jitter specification of the target clock such as period indicated by a label 310 in FIG. 3B. The system applied the fractional structure may occasionally abnormally work because the unstable period may result in some elements of the system work abnormally. Accordingly, the fractional structure are typically employed in those applications that the frequency difference between reference clock and target clock is larger enough, for example, 100 and 32 MHz, respectively. It is especially unsuitable to use the fractional structure for the other applications that quick clocks are desired.

The second DCO structure is so-called phase-hopping DCO structure, FIGS. 4A and 4B respectively illustrates the schematic and timing diagram according to the conventional phase-hopping structure. The phase-hopping structure shown in FIG. 4A basically encompasses a fixed high frequency oscillator 402, a divide-by-N divider (DIV) 404, an L-tapped delay line 406, a multiplexer (MUX) 408, an adder 410, a $\log_2(L)$-bits latch 412, and an L-to-1 MUX. In operations, DIV 404 generates the target clock whose frequency equals to the quotient of $F_{CK\_OSC}$ dividing by an integer. For example, an oscillator 402 of 32 MHz clock can be divided by an integer 16 to obtain a target clock of 2 MHz. Output of the DIV 404 is routed into the $\log_2(L)$-bits latch 412 to generate an L-bit outputs as control signals input to L-to-1 MUX 414 for selecting output clock $S_{OP}$ from the cascade delay elements.

Control signals from external PLL such as from the loop filter 204 can be input into a carry or borrow terminal of the muiltiplexer for adjusting the frequency of output clock $S_{OP}$. For example, a borrow signal will cause MUX 408 to select "–1" to decrease one in $\log_2(L)$-bits latch 412, thus slow down the output clock from the L-to-1 MUX 414 as described by label 416 in FIG. 4B. In contrast, a carry signal will force MUX 408 to select "1" to fasten the output clock $S_{OP}$. If PLL works stable, MUX 408 will outputs "0" to force $\log_2(L)$-bits latch 412 to freeze at current frequency. Some advantages offered by the phase-hopping structure. Firstly, a very simpler structure is provided by the phase-hopping structure, for example, by applying logic gates can easily construct the phase-hopping structure. Secondly, the output jitter of the phase-hopping structure also achieves the designed requirement (e.g., 16 UI), and the average frequency of the output clock is substantially the same as the target clock. However, a fatal disadvantage is that the frequency of CK_OSC must be integer times for all derived target clocks, which indicates that only some applications can employ the phase-hopping scheme.

Please refer to FIGS. 5A and 5B, which respectively illustrate a schematic diagram and a waveform diagram of a conventional tapped delayed-line DCO structure. Typically, tapped delay-line DCO structure generates a starting clock that faster than the required target clock by using a programmable divider (DIV) 508 to divide CK_OSC from oscillator 510, the starting clock is then routed to an L-bits latch 504. L-bits latch 504 then outputs signals to an L-to-1 MUX 502 that is further controlled by a delay look-up circuit 512 to control the output clock $S_{OT}$. Please note that a programmable divider (DIV) 514 and a selector 516 having the same functions as in FIG. 3A can be used to generate the target clock, for example, the parameters A, M, N are input to the selector 516 in advance. Output signal of the selector 516 is then routed to delay look-up circuit 512 to control $S_{OT}$ output from L-to-1 MUX 502. Moreover, the delay interval of each delay element of the L-taps delay line 504 will vary as processes which the delay elements are fabricated. And furthermore, additional parameters, such as the environment temperature that the delay elements are allocated, will bring the designed delay interval to be somewhat distorted. However, tapped delayed-line DCO structure employs a cycle detector 506 to obtain phase differences between the currently delay interval of the delay element and the output clock $S_{OT}$, and then directs the detection results to delay look-up circuit 512. Therefore, $S_{OT}$ will be a clock that satisfies the requirements of applications even the delay interval is varied with environment.

Although the tapped delayed-line DCO structure offers some important advantages, such as a relative small output jitter, the frequency of the generated clock equals to the counterpart of the target clock as described in FIG. 5B, and duty cycle is 1:1; however, a complicated and tremendous delay look-up circuit is required to store a great deal of information. Furthermore, incredibly additional information is needed even only one delay element is increased in the tapped delayed-line, which indicates that the design of the delay look-up circuit becomes a manufacture and time costly job.

Obviously, the conventional approaches can overcome/bring some disadvantages/advantages simultaneously, however, the provided functions and manufacture costs become a trade-off that can not satisfy requirements of the modern technologies. A need has been arisen to disclose a circuit and accompanied with a method that can overcome the disadvantages of the conventional DCO structures and preserve the advantages of less manufacture cost and precisely controlling frequencies of the output clocks.

SUMMARY OF THE INVENTION

The principal object of the invention is to provide a digitally controlled oscillator that satisfies the designed jitter specification and accompanied with a simple structure.

The other object of the invention is to provide a digitally controlled oscillator that adjusts its output clocks with no delay look-up circuit.

According to the above objects, the present invention discloses a DCO circuit that combines the conventionally fractional and tapped delayed-line structures to generate the required target clocks, the build-in tapped delayed-line can also precisely control the output clocks as conventionally. Frequencies and phases between the required target clock generated by a fractional structure and the output clock generated by a tapped delay-line are compared to drive a K-counter loop filter for counting. When the output clock is faster than the target clock to force the stored value of the K-counter loop filter increasing to a first preset threshold, a control logic will be driven to slow down the output clock by controlling outputs of the tapped delay-line. On the other hand, the control logic will also be driven to speed up the output clock by controlling outputs of the tapped delay-line when the output clock is slower than the target clock and forces the stored value of the K-counter loop filter to decrease to a second preset threshold. The aforementioned adjusting steps keep going until the output clock is substantially the same with the target clock.

Additionally, signals from external of the disclosed DCO circuit are routed into the fractional structure to change the frequency of the target clock, which indicates that the output clock can be properly calibrated according to environment parameters without additional elements or circuits.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
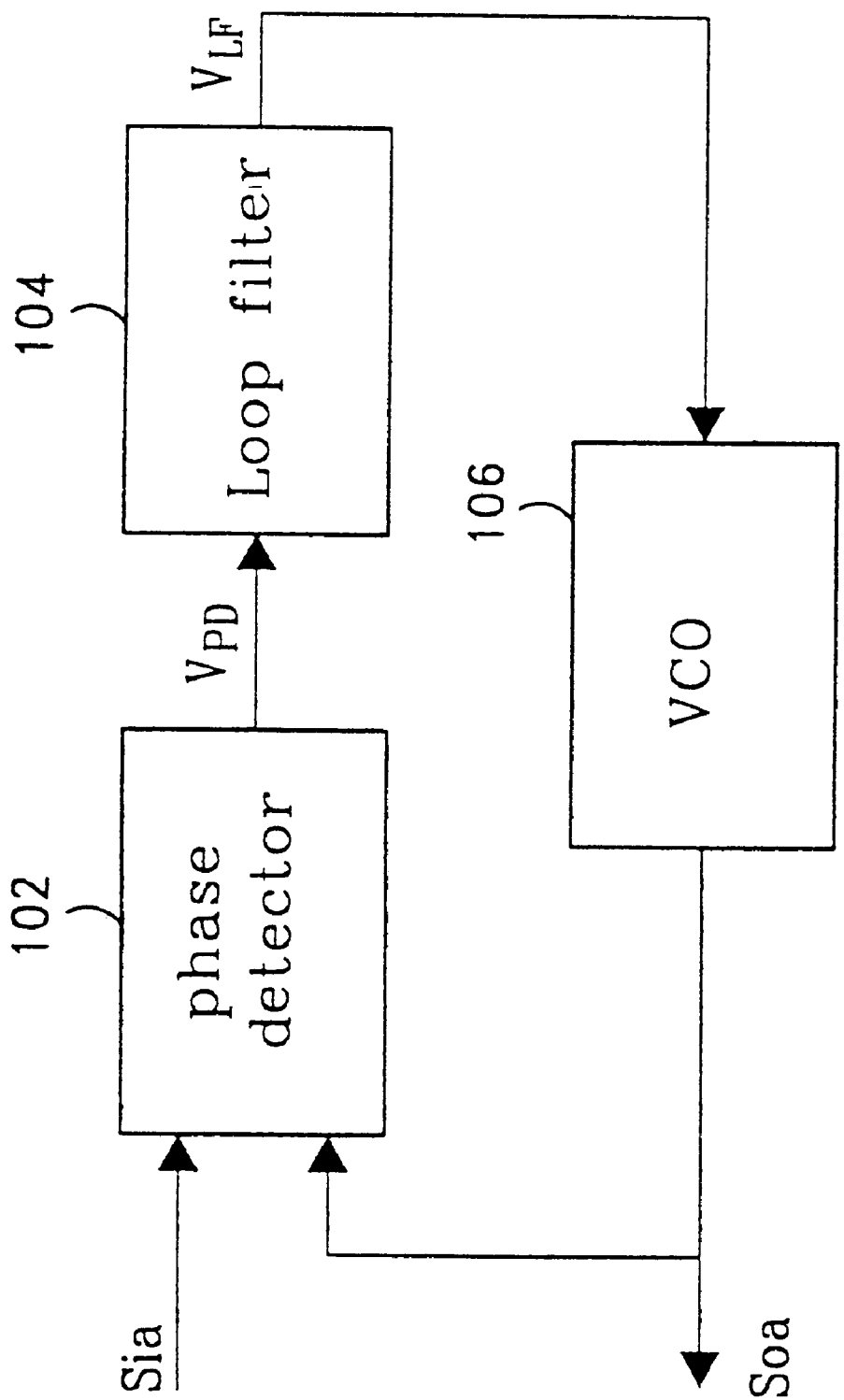
FIG. 1 depicts a schematic diagram representative of a conventional analog PLL.
Figure 2:
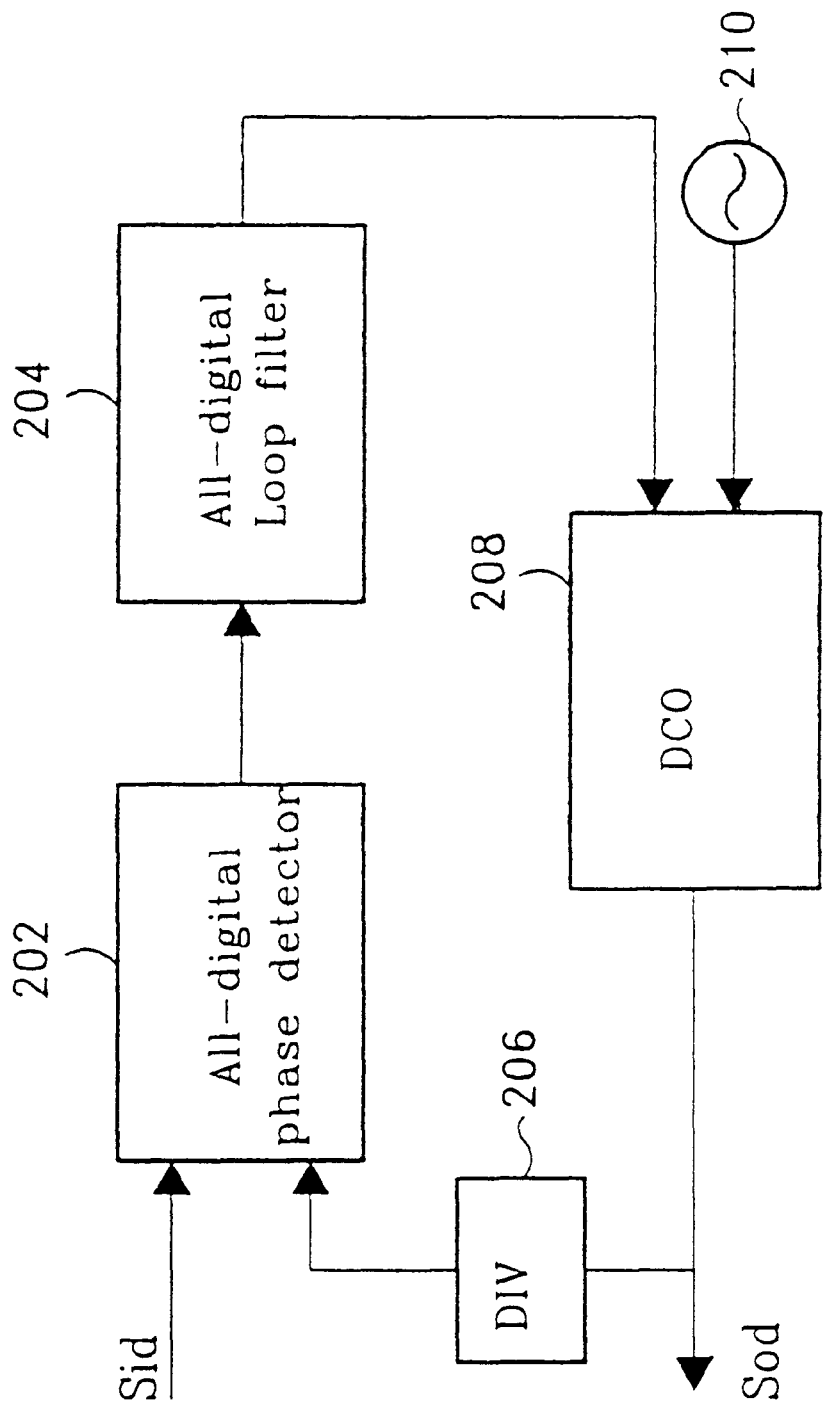
FIG. 2 depicts a schematic diagram representative of a conventional digital PLL.
Figure 6:
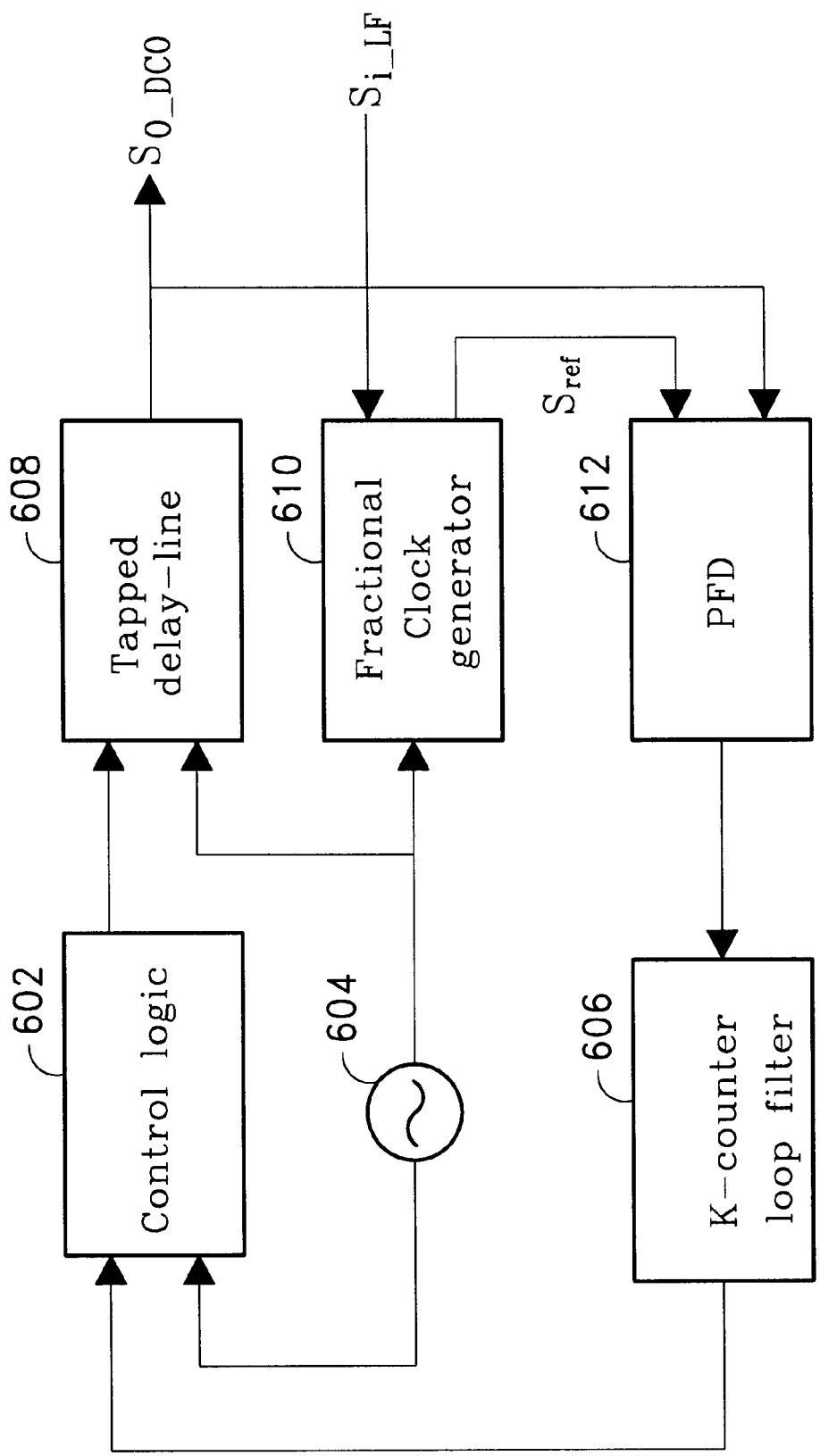
FIG. 6 depicts a schematic diagram representative of an embodiment according to the present invention.

Please refer to FIG. 6, a schematic diagram is illustrated for the disclosed DCO circuit, which basically encompasses a control logic 602, a fixed high frequency oscillator 604, a K-counter loop filter 606, a tapped delay-line 608, a fractional clock generator 610, and a phase-frequency detector (PFD) 612. DCO circuit in FIG. 6 receives a clock CK_OSC generated by the fixed high frequency oscillator 604 (may be identity with the reference clock 210) and a signal $S_{i\_LF}$ from all-digital loop filter 204 to provide an output clock $S_{O\_DCO}$ (i.e., $S_{od}$ of FIG. 2) for the system that the DCO circuit is build-in. As noted, CK_OSC and $S_{i\_LF}$ are directed into the fractional clock structure 610 to generate a target clock $S_{ref}$ that is further routed to PFD 612 and accompanied with the output clock $S_{O\_DCO}$ to compare their frequencies and phases. A carry or a borrow pulse will be enabled to drive the K-counter loop filter 606 for controlling the stored value (detailed descriptions are given later). The stored value of the K-counter loop filter 606 will be transferred to the control logic 602 to select a delay element from the tapped delay-line 608 and direct its output as $S_{O\_DCO}$. Further detailed descriptions of the aforementioned structures with operations are given hereinafter.

Figure 7A:
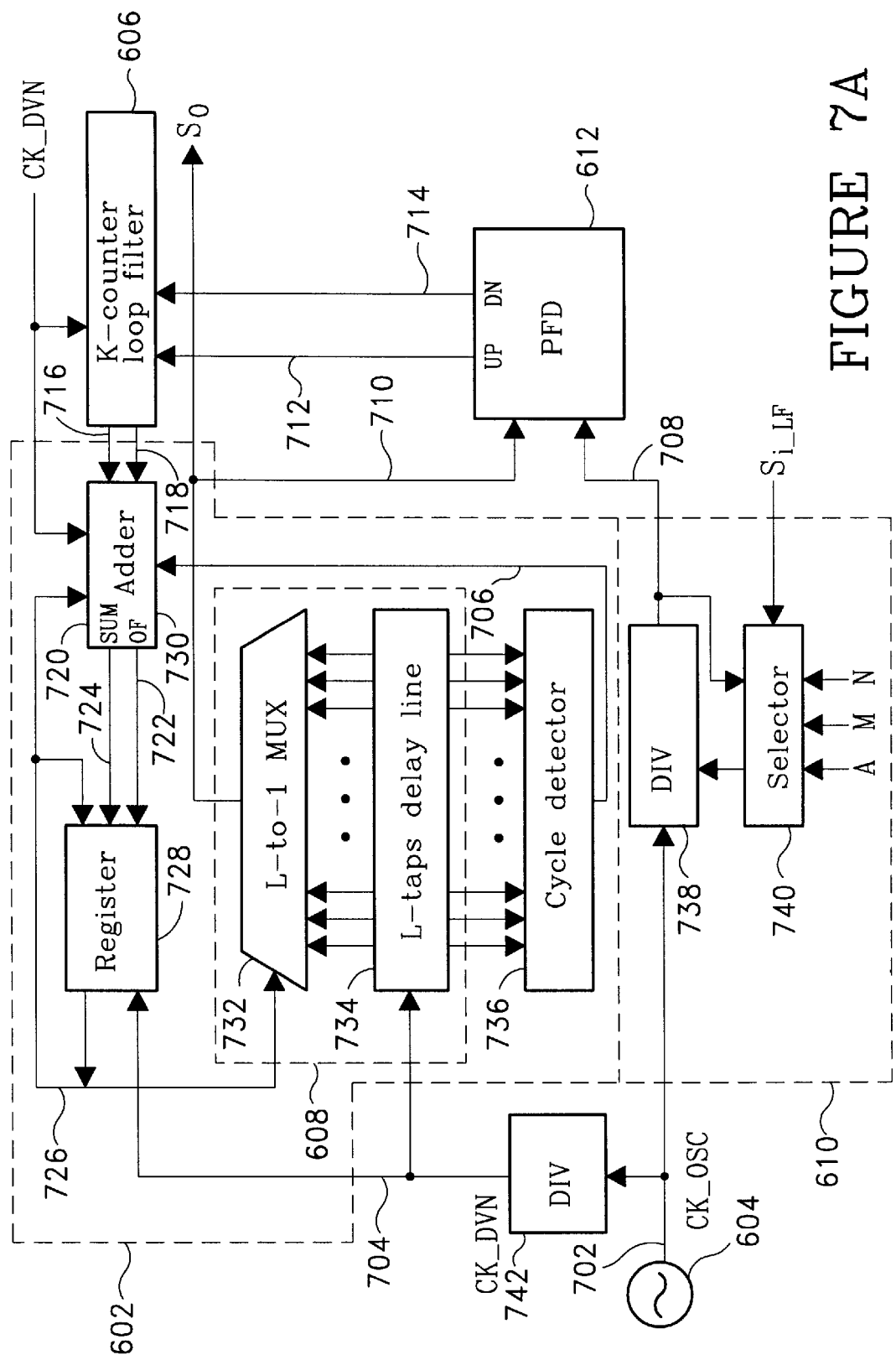
FIG. 7A depicts a schematic diagram representative of a detailed structure of the embodiment.

FIG. 7A illustrates the detailed schematic diagram of the embodiment, labels used in FIG. 6 are also followed in FIG. 7A. According to FIG. 7A, the control logic 602 basically includes a register 728, an adder 730, and a cycle detector 736. Furthermore, the tapped delay-line 608 is composed of an L-to-1 MUX 732 and an L-taps delay line 734, and fractional clock generator 610 consists of a divide-by-N divider (DIV) 738 and a selector 740. Please note that the structures of the above-mentioned K-counter loop filter 606 and PFD 612 have been commonly demonstrated in articles or textbooks and well-known by the skilled persons. Moreover, only the structures of the adder 730, and the circuits connected with the cycle detector 736 are different with the conventional approaches, detailed descriptions of them are given following. Additionally, waveform diagrams of the indicated nodes and signal lines in FIG. 7A are displayed in FIG. 7B for showing the voltage variations.

Figure 3A:
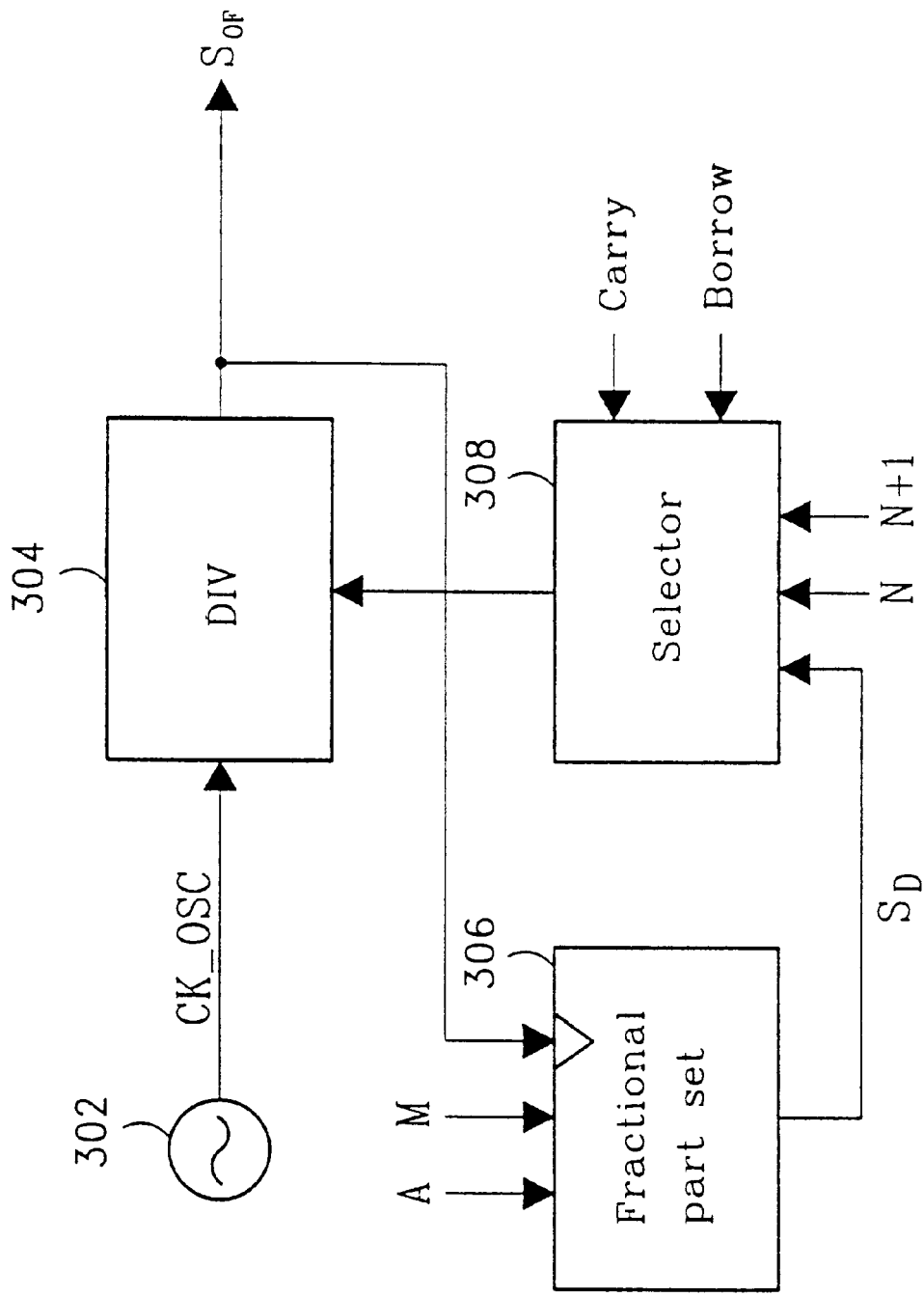
FIG. 3A depicts a schematic diagram representative of a conventional fractional structure.
Figure 3B:
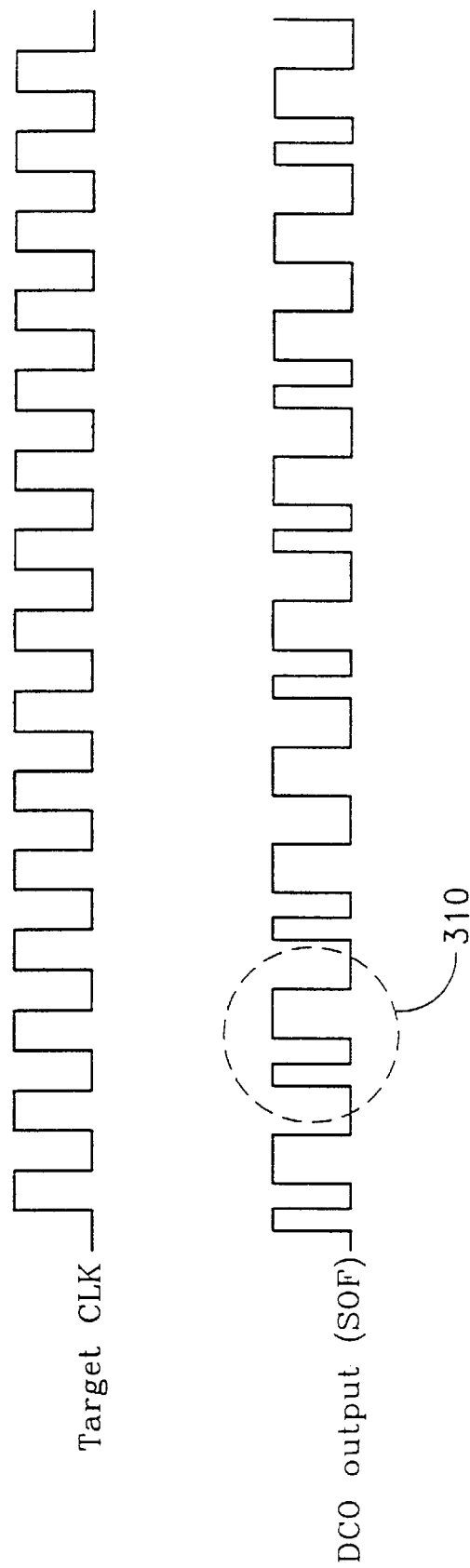
FIG. 3B depicts a waveform diagram representative of the waveform generated by the circuit of FIG. 3A.
Figure 4A:
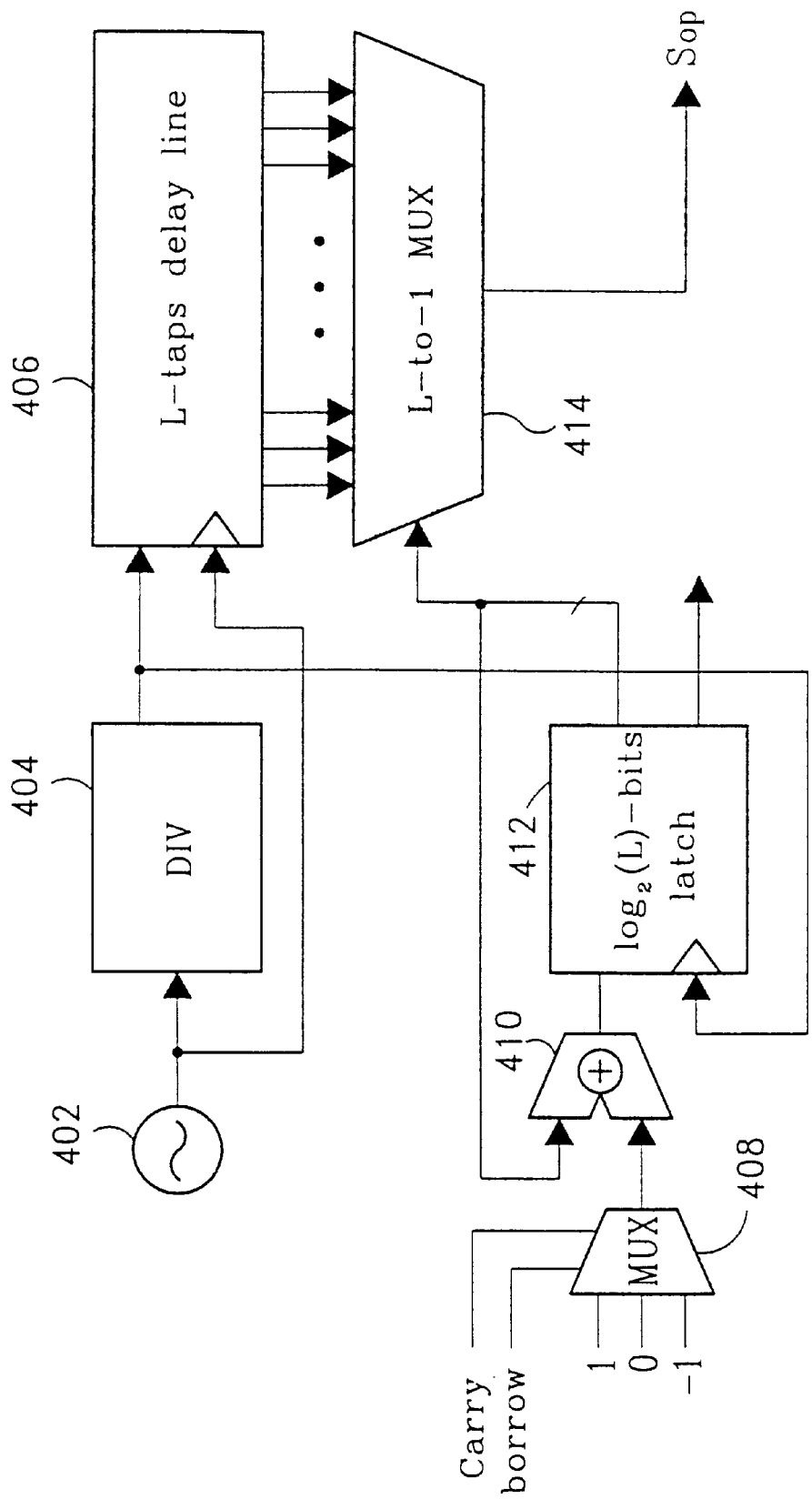
FIG. 4A depicts a schematic diagram representative of a conventional phase-hopping structure.
Figure 4B:
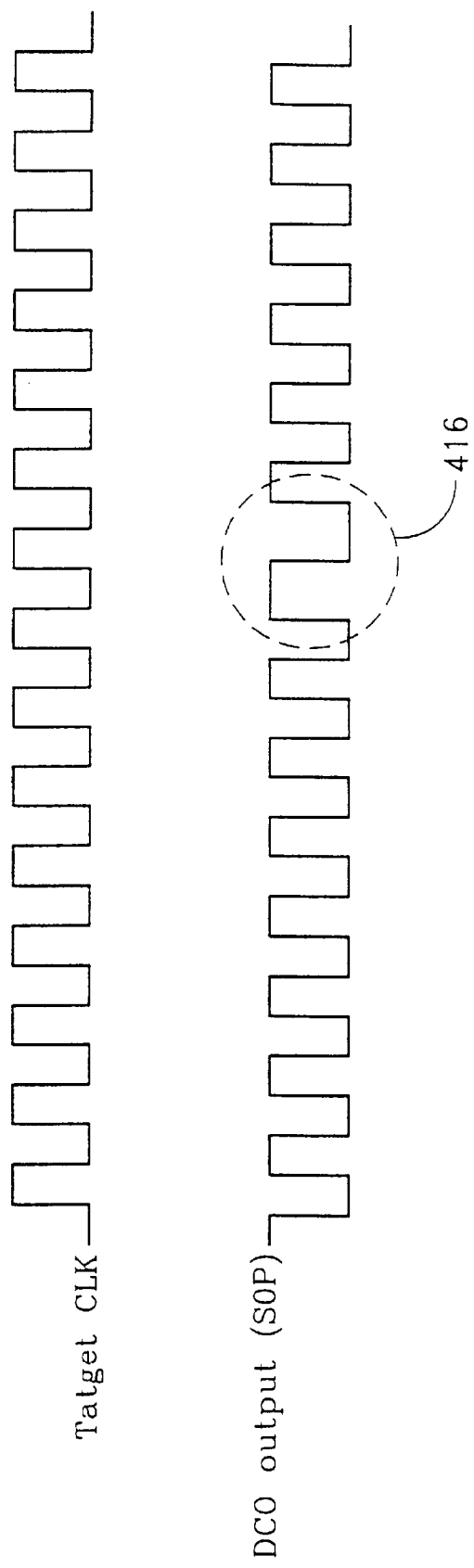
FIG. 4B depicts a waveform diagram representative of the waveform generated by the circuit of FIG. 4A.
Figure 5A:
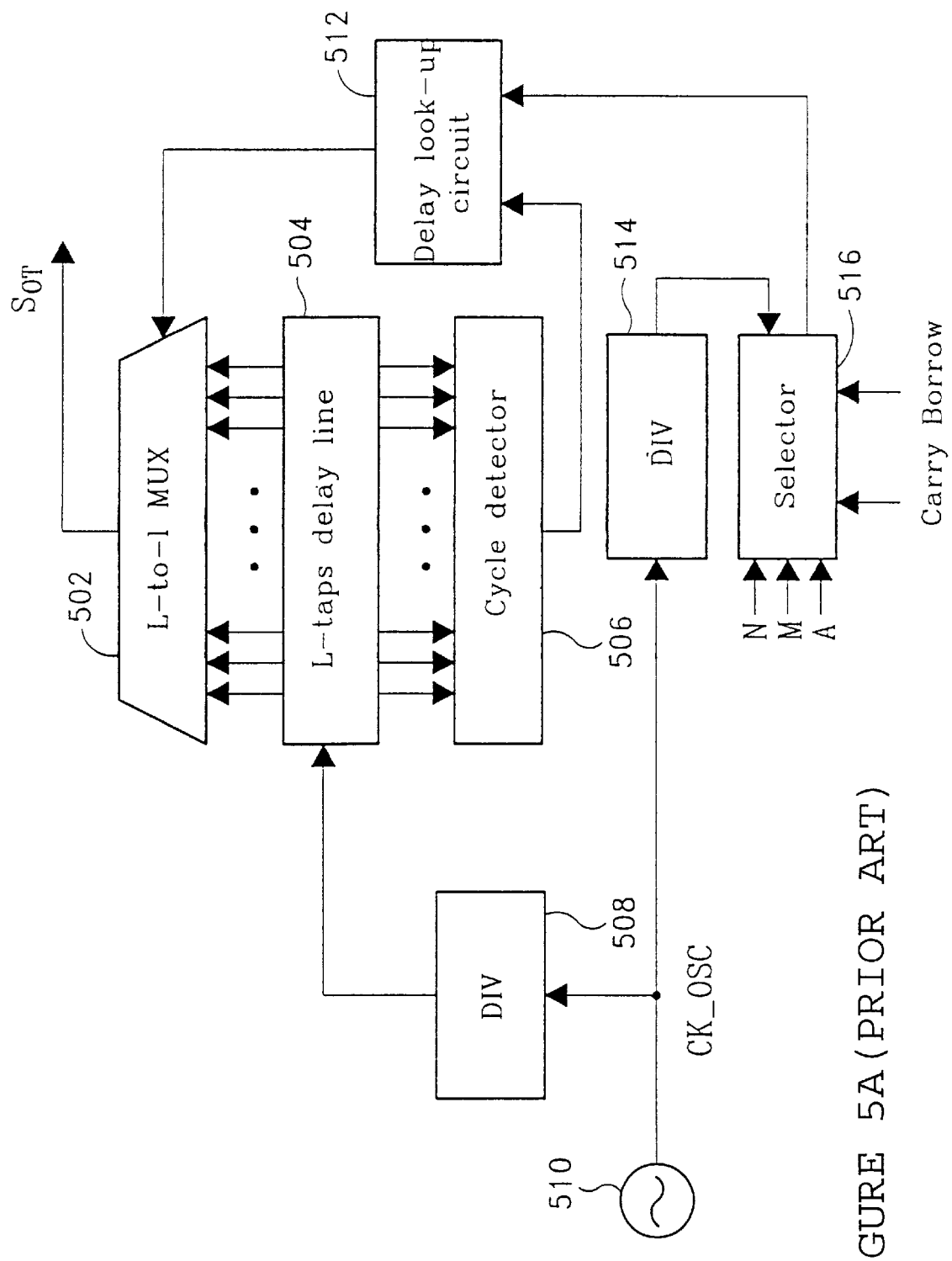
FIG. 5A depicts a schematic diagram representative of a conventional tapped delay-line DCO structure.
Figure 5B:
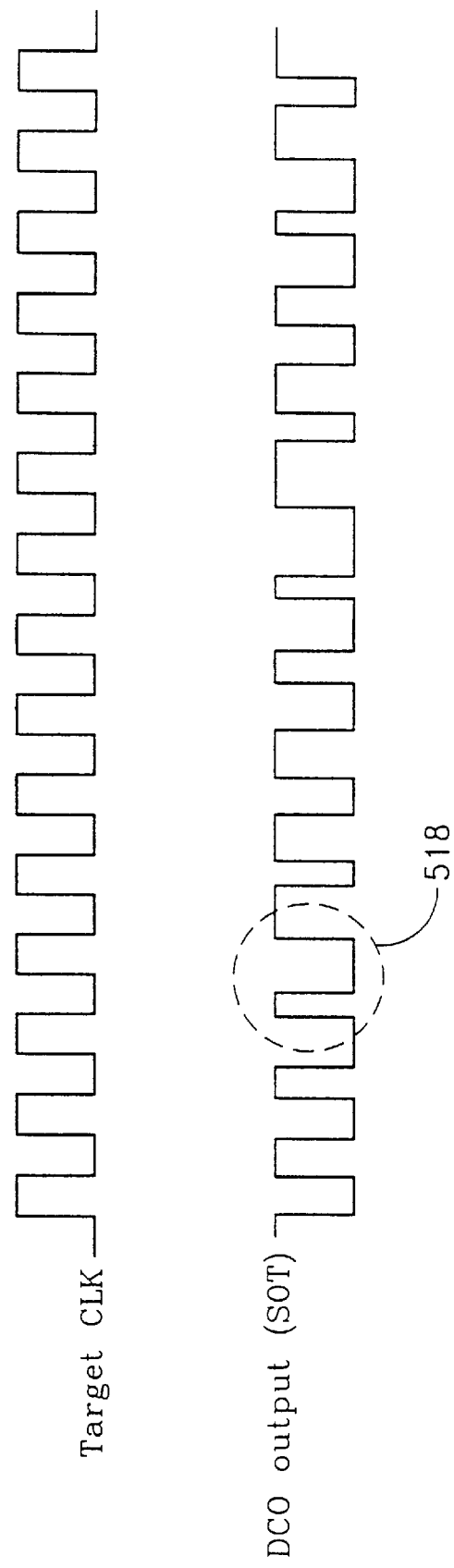
FIG. 5B depicts a waveform diagram representative of the waveform generated by the circuit of FIG. 5A.

Because the average frequency of the output clock generated by the fractional structure is the same as the target clock as described above, the embodiment thus employs the fractional clock generator 610 to generate a reference clock treated as the required target clock. As noted, the selector 740 includes a fractional part set 306 and a selector 308 in FIG. 3A due to the described conventional scheme is applied. Additionally, the skilled persons can construct many fractional structures that are also included within the spirit and scope of the appended claims. On the other hand, the embodiment applies the conventional tapped delay-line DCO structure and accompanied with the fractional structure to precisely control the output clock, thereafter the required delay look-up circuit conventionally can be eliminated.

Figure 7B:
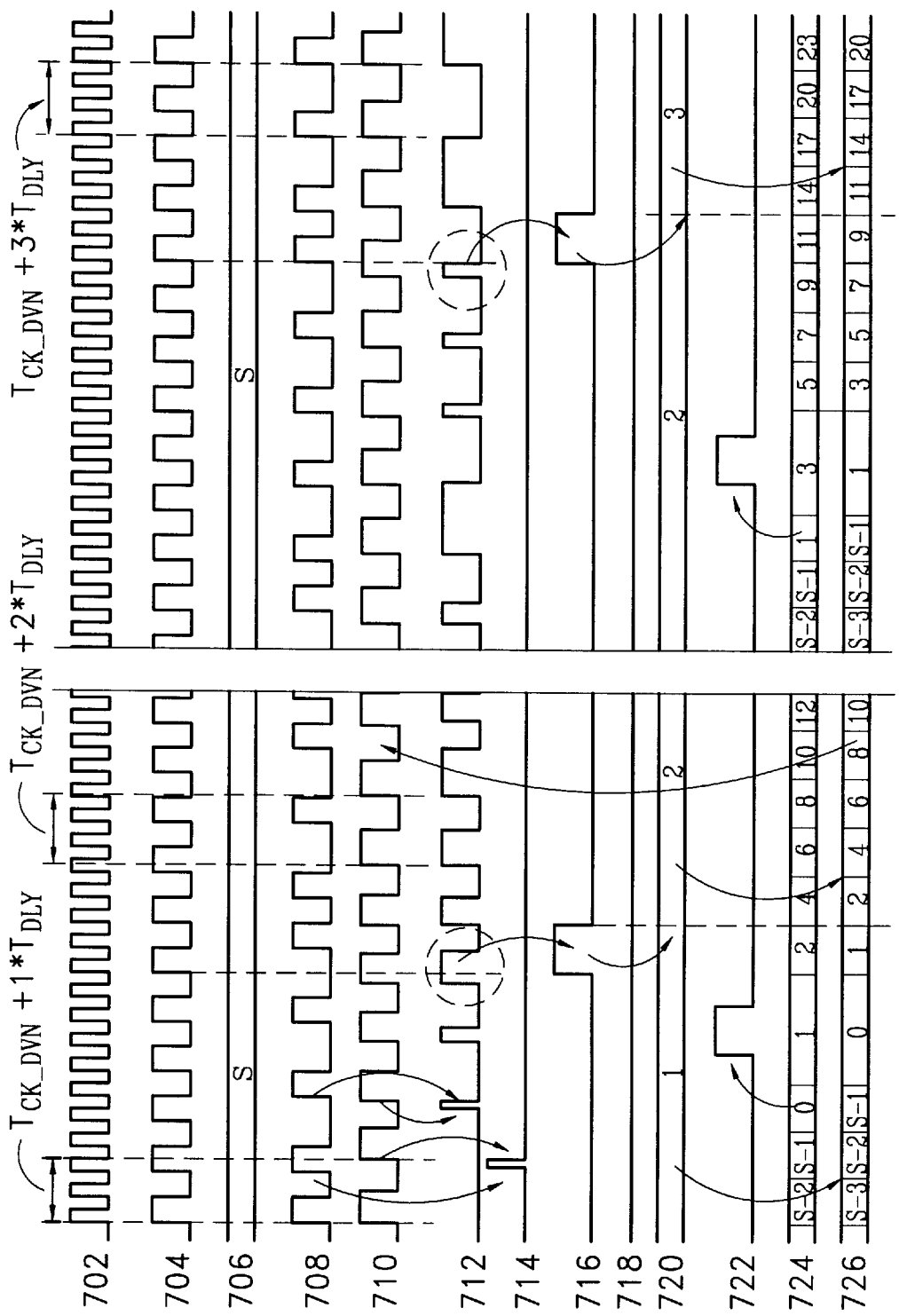
FIG. 7B depicts a waveform diagram representative of the voltage variations of the indicated nodes and signal lines in FIG. 7A.

FIG. 7A and accompanied with FIG. 7B are used to more detailed demonstrate the embodiment. Please refer to FIG. 7B, which indicates a waveform diagram illustrative of the voltage variations of the indicated nodes and signal lines of FIG. 7A. For example, labels 702, 704, and 706 respectively denote variations of CK_OSC, a clock CK_DVN which is divided from CK_OSC by using a divide-by-N divider (DIV) 742, and the stored values of the cycle detector 736. In the preferred embodiment, the frequency of CK_DVN is a half of CK_OSC, and the value of label 736 indicates a ratio between the period of CK_DVN and the delay interval of the delay element. For example, the stored value "S" in FIG. 7B means that CK_DVN substantially equals to a summation of delay intervals of "S" delay elements. Labels 708 and 710 respectively indicate the target clock and output clock $S_O$, wherein the target clock is generated by a programmable 738 and accompanied with the selector 740 and CK_OSC. $S_O$ is also fed back to PFD 612 to compare with the target clock 708. As noted, $S_O$ (at signal line 710) and target clock 708 are not synchronous initially, therefore phase difference exists between the above two clocks.

PFD 612 compares $S_O$ and the target clock 708, and furthermore outputs the time intervals indicated by labels 712 (from UP terminal) or 714 (from DN terminal) for respectively indicating $S_O$ being leading or falling the target clock 708. Please note that pulses of labels 712 and 714 will modify the stored value of the K-counter loop filter 606, a carry or a borrow signal will be respectively directed to the adder 730 from terminals indicated by 716 and 718 when the stored value reaches to K or −K. As noted, K is a positive integer and the above carry or borrow pulses are enabled when $S_O$ is too fast or too slow, respectively. In other words, the carry and borrow signals are respectively enabled when the stored value reaches to K or −K. Additionally, because $S_O$ can be fastened or enlarged when K or −K being reaches, a designer can adjust the parameter K to force the designed DOC circuit to be more sensitive. For example, a smaller K will frequently adjust the time interval of $S_O$ than a larger K.

Adder 730 outputs a "SUM" and a "Overflow" signal to register 728 respectively from terminals SUM and OF, wherein "SUM" is used to indicate the selected delay element of the L-taps delay line 734 so that output of the selected delay element will become $S_O$. OF signal indicates the situation when the selected delay element is out of the range of the entire delay elements, so that $S_O$ will be output from the starting end of the cascade delay elements, and information of SUM and OF indicated by 724 and 722 is then routed to register a 728. Label 720 indicates the stored value of adder 730 that is used as a base for adding in every period of $S_O$, wherein the stored value 720 is under controlled by OF. The stored value of register 728 is directed to L-to-1 MUX 732 along the label 726 for achieving the controlling purpose. Moreover, the stored value 726 also feeds back to adder 730 to be treated as another base of adder 730 so that output of the selected delay element is then routed to L-to-1 MUX 732 to be $S_O$. Finally, $S_O$ is routed to PFD 612 for comparing with the target clock 708, the stored value of the K-counter loop filter results in the modifications of $S_O$ when it arrives at preset K or –K. Likewise, when the delay interval of the delay element is shortened such as while the environment temperature is down, a faster $S_O$ will be detected by the cycle detector 736 so that the stored value 706 will be changed. Adder 730 therefore enlarges the currently output $S_O$ to be required target clock again, which prevents the disclosed DCO circuit from being influenced by environment parameters.

As noted, many pulses appear at signal 712 in FIG. 7B because a faster clock, for example, a clock generated by dividing CK_OSC by 2, is provided as initial output clock $S_O$ in the embodiment, but there is no information denoted by signal 714. Additionally, there is almost no pulse appears at both of signals 712 and 714 when $S_O$ is almost the same as the target clock 708. $S_O$ will thus be stable because the stored value 720 of adder 730 will be frozen as a constant.

Please note that "Overflow" detection is quite an important task, otherwise a too fast clock will be output as $S_O$ that should be the next arrived period of the target clock. For instance, when delay interval, quantities of the entire delay elements, and the selected delay element are respectively 1, 40, and 40, the first delay element of the tapped delay-line will be reused because there is no forty-first delay element. However, two $S_O$ periods will be overlapped when the first delay element outputs to be $S_O$ immediately so that one $S_O$ period disappears. To prevent the disadvantage, it must abandon all outputs of the delay elements at the currently CK_DVN period, so that output of the first delay element will be not routed until the next CK_DVN comes. Therefore, OF terminal (labeled 722) of the adder 730 will be pulled to logic 1 to activate the register 728 to keep the currently stored value instead of replacing the currently stored value by the transferred value from SUM terminal.

Figure 8A:
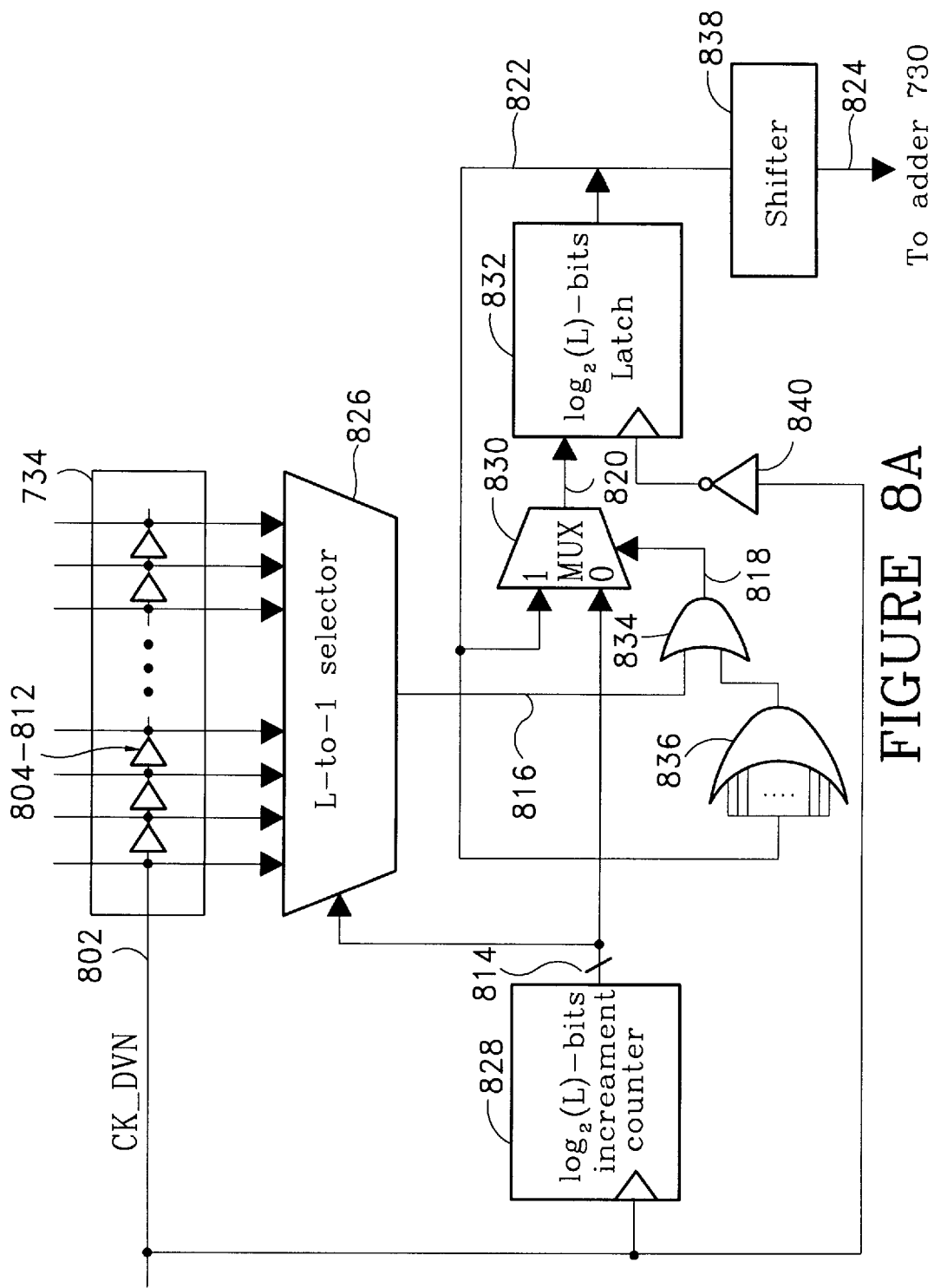
FIG. 8A depicts a detailed schematic diagram of the cycle detector in FIG. 7A.
Figure 8B:
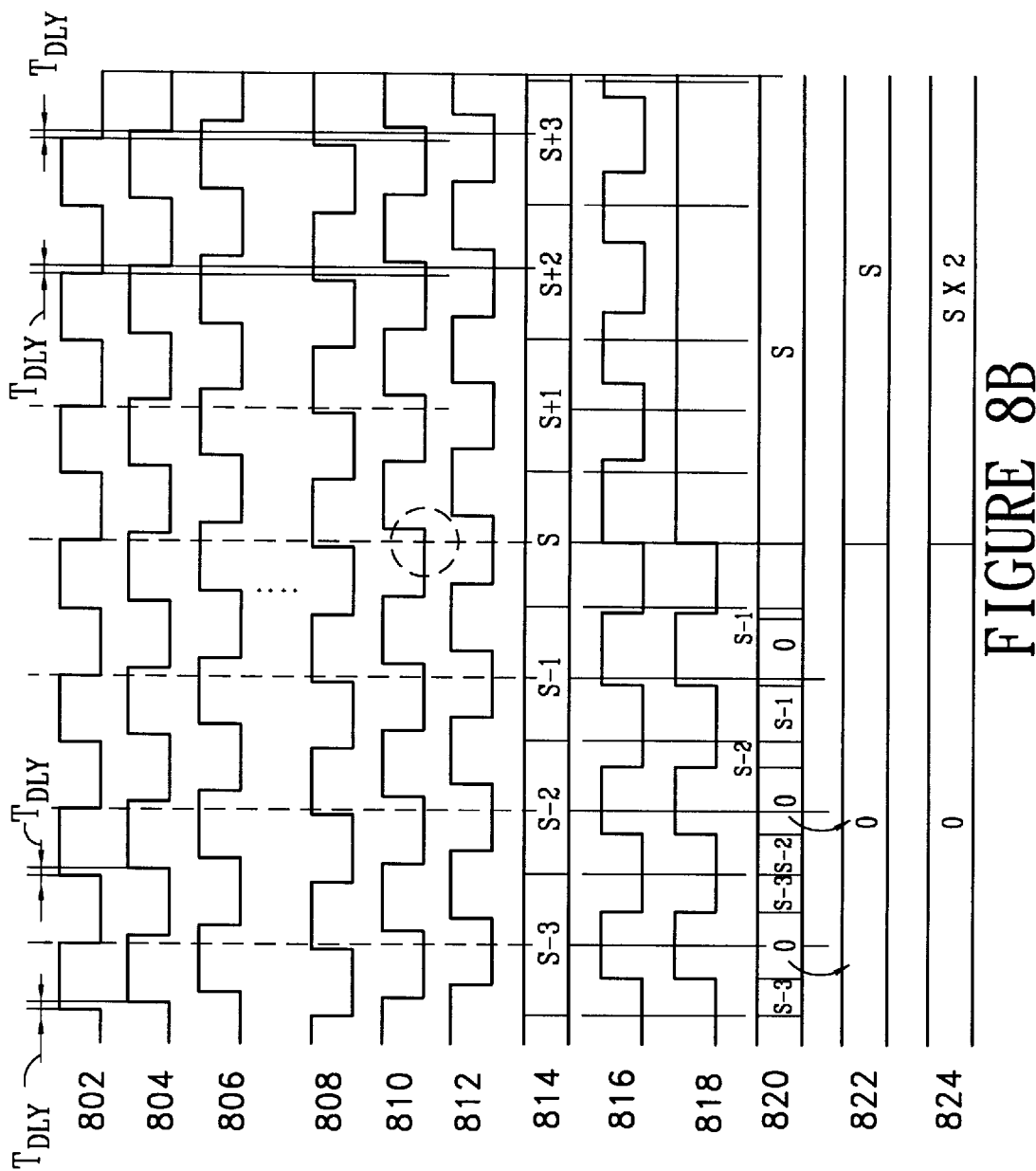
FIG. 8B depicts a waveform diagram of the voltage variations of the indicated nodes and signal lines in FIG. 8A.

Referring to FIG. 8A, a detail diagram of the cycle 736 accompanied with the connection circuits is depicted therein, detail structure of the L-taps delay-line 734 is shown for giving more descriptions. FIG. 8B depicts a waveform diagram representative of voltage variations of indicated nodes and signal lines. Additionally, CK_DVN (labeled as 802 in FIGS. 8A and 8B) is routed into L-taps delay-line 734 that is composed of cascade connected delay elements. Each the delay element can be a buffer for delaying its input signal. Waveforms of the first and second delay elements 804 and 806, and three selected delay elements 808, 810 and 812 of the L-taps delay-line 734 are shown for descriptions, wherein the delay element 810 is the "S" delay element, and $T_{DLY}$ is the delay interval as described above. As noted, all the descriptions of the cycle detector 736 are used as the explanation purpose, all the skilled persons in the art can modify the disclosed structure, such as instituting the disclosed circuit by other logic gates, which still includes within the spirit and scope of the appended claims.

The cycle detector 736 detects the period ratio of delay interval of each delay element to the period of CK_DVN, which also indicates that the CK_DVN period equals to "S" times of the delay interval of one delay element. The computed period ratio will be an adding base for adder 730. In operations, the $\log_2(L)$-bits counter increment 828 increases one (i.e., add 1 to the currently stored value) when CK_DVN arrives, the stored value of $\log_2(L)$-bits counter increment 828 is then input to MUX 830 as one of candidates for storing in latch 832. Moreover, another input terminal of MUX 730 feeds back the stored value of latch 832. Therefore an OR gate 834 is used to select a value from the above two candidates to store in latch 832. Additionally, each bit of the stored value 822 is also input to an OR gate 836 so that the generated logic result is further routed into an OR gate 834 to perform a logic OR operation with output of L-to-1 MUX 826. The derived logic result 818 from the L-to-1 MUX 826 is then directed to MUX 830 for controlling purpose. An inverter 840 receives CK_DVN to generate a signal having inverted phase of CK_DVN, which is employed as a triggered signal of the latch 832 for storing the selected value 820 by MUX 830.

As noted, the cycle detector 736 performs sampling operations at falling edges (voltages from high to low) of CK_DVN, therefore the sampled value must be multiplied by 2 to indicate the period ratio of CK_DVN and the delay interval of the delay element. A shifter 838 is thus applied to perform a shift left operation of the stored value 822 before transferring to adder 730 for storing. Furthermore, "0" and "1" in MUX 830 denotes two candidates are input thereon, the logic operation of OR gate 830 can be used to determine which one of the candidates at the "0" and "1" terminals is the selected. For example, the logic operation "0" or "1" will select the stored value 814 of $\log_2(L)$-bits counter increment 828, or the feedback stored value 822 of the latch 832, respectively.

Operations of the cycle detector 736 are described in the following. In the beginning when all the disclosed DCO circuit starts to work, the output of latch 832 will be logic 0 because the stored value 822 is logic 0, too. Furthermore, the first delay element 804 will be selected for outputting as $S_O$ from selector 826 due to the initial value of the $\log_2(L)$-bits counter increment 828. A high voltage is detected from CK_DVN labeled by 840, OR gate 834 outputs a logic 1 to force latch 832 to restore the stored value 822 (logic 0, now). The restore operation keeps going until a falling edge of CK_DVN detects a low voltage output from delay element 810. At this time, the output of the delay element 810 is routed to L-to-1 selector 826 and further being output from output terminal of the L-to-1 selector 826 as a circle composed of dot lines in FIG. 8B. The high voltage that the falling edge of CK_DVN used to sample can not be detected from now on, therefore a logic 0 output from OR gate 834 will drive latch 832 to store the stored value 814 from $\log_2(L)$-bits counter increment 828. As noted, the stored value 814 just equals to "S"th delay element of L-taps delay-line 734 in FIG. 8A, and the stored value 814 multiplies 2 (i.e., S×2) in shifter 838 before routing to adder 730 for saving. Logic 1 is always derived from OR gate 836 due to a non-zero value stored in latch 832, the stored value 822 will be frozen from now on because OR gate 834 also outputs logic 1. FIG. 8B clearly illustrates variations of the stored values 814 and 822, which are respectively the stored values of $\log_2(L)$-bits counter increment 828 and latch 832.

Figure 9:
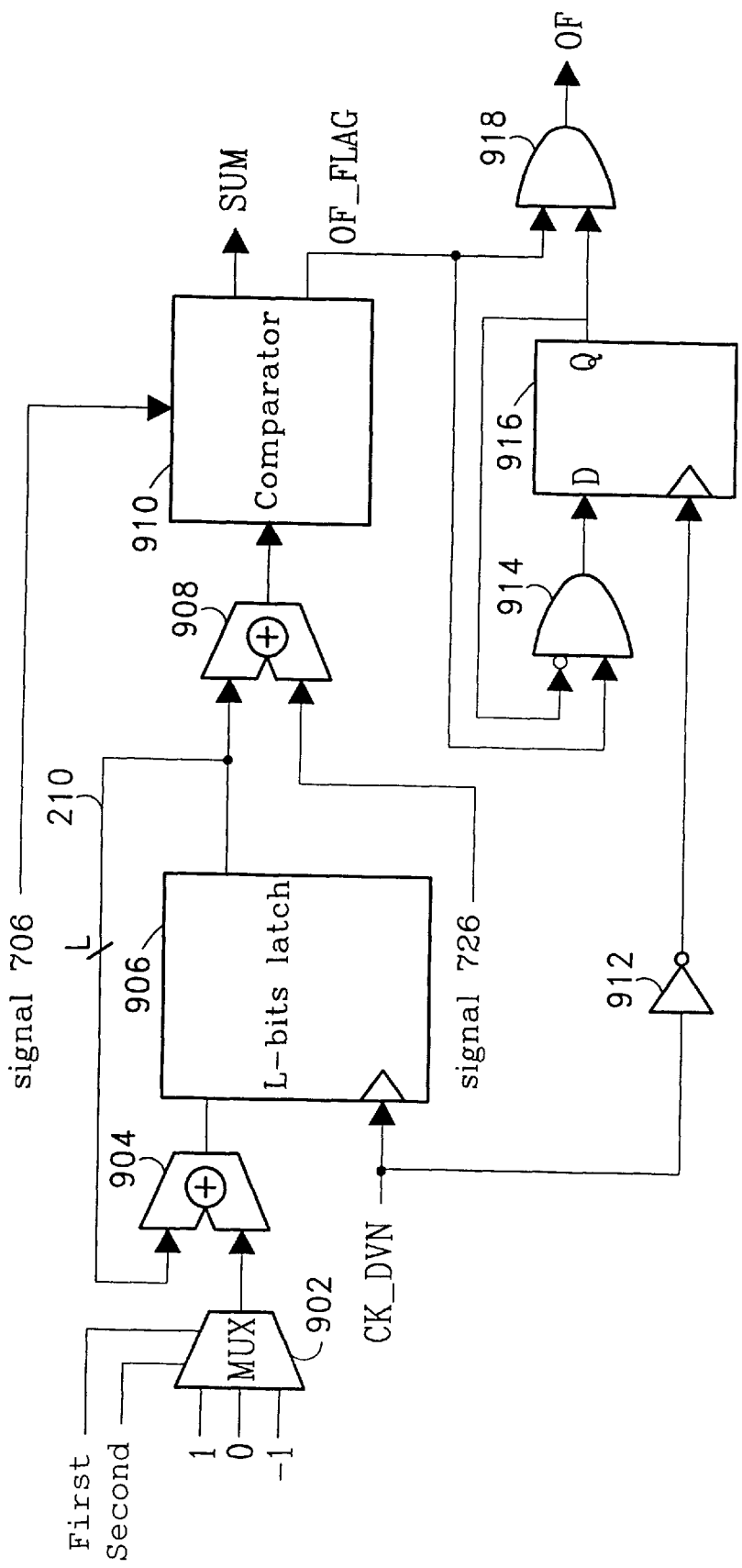
FIG. 9 depicts a detailed schematic diagram of the adder in FIG. 7A.

FIG. 9 gives a more detailed functional diagram of the adder 720, the skilled persons in the art can modify the disclosed structure such as replacing the disclosed logic gates by another that still includes within the spirit and scope of the claims. A first and a second signal respectively labeled by 716 and 718 are directed into a MUX 902 as control signals for output candidates. Please note that both the above first and second signals come from K-counter loop filter 606 but from loop filter 204. Three candidates "−1", "0", "1" of MUX 902 are provided for indicating "shortening", "maintaining", "enlarging" the period of output clock $S_o$ (detail descriptions are given later). One of the aforementioned three candidates that directed from MUX 902 to an adder 904 will sum with the stored value of L-bits latch 906, the obtained summation is then store back to L-bits latch 906 again. Next, the stored values of both the L-bits latch 906 and the register 728 are added to generate a serial number for indicating the selected delay element. For example, a summation of S-2 indicates that the (S−2)th delay element of the L-taps delay-line 734 is selected to output as next period of $S_O$.

Additionally, because the finite delay elements encompassed in L-taps delay-line 734, it is necessary to return back to the initial end of the cascade delay elements (i.e., return to delay element 804) for consecutively outputting $S_o$ when last delay element has been selected. Therefore, the summation of adder 908 will be compared with the store value 706 in comparator 910. If the summation is smaller than the store value 706 then routes the summation from a SUM terminal, otherwise a difference derived from the stored value 706 minus with the summation is directed from the SUM terminal, and accompanied with an enabled flag OF_FLAG. An overflow signal finally outputs to register 728 through OF terminal after AND gate 914 and 918, a flip-flop 916 complete their operations.

The function of the mentioned above first and second signals are described in the following. A first signal will be input to MUX 902 when currently output clock $S_O$ is faster than target clock, therefore high voltage outputs continuously appears at terminal 712 (i.e., illustrated as FIG. 7B) to force MUX 902 outputs 1 which further adds with the pre-stored value of L-bits latch 906 before storing back to the L-bits latch 906. Next period of the output clock $S_o$ is then enlarged to include one further delay interval of the delay element. Accordingly, when first signal output from label 716, $S_O$ period will become $T_{CK\_DVN}+2 \ast T_{DLY}$ ($T_{CK\_DVN}$ is period of CK_DVN) but $T_{CK\_DVN}+T_{DLY}$ originally. In contrast, MUX 902 will be driven by a second signal to output "−1" transferred to L-bits latch 906 so that $S_O$ period being shorten. $S_O$ period currently will be kept when MUX 902 outputs "0".

Figure 10:
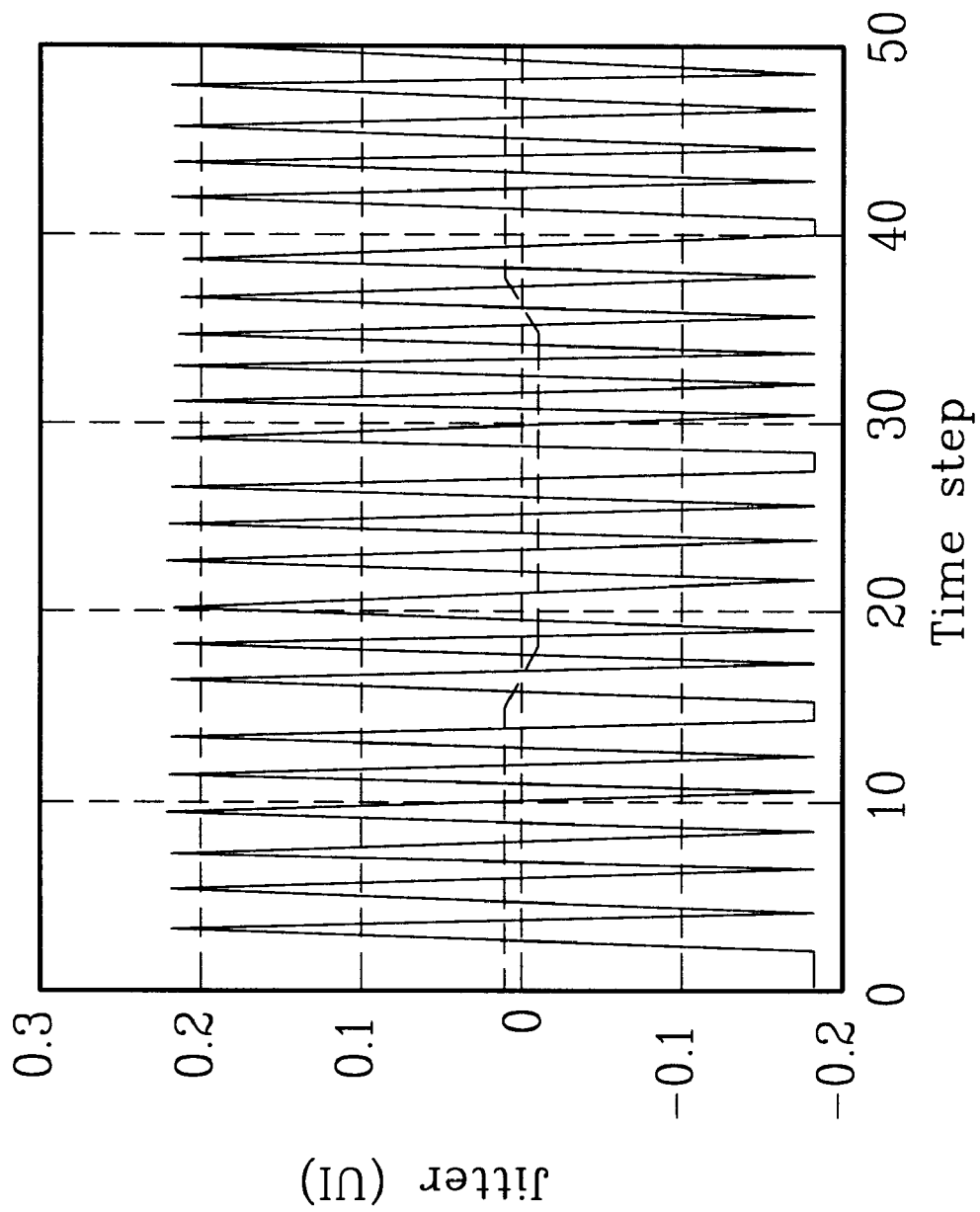
FIG. 10 depicts a diagram representative of the output jitter of the disclosed DCO structure.

FIG. 10 represents a diagram illustrative of the output jitter that varies with time. A solid line in FIG. 10 indicates the output jitter of the conventionally fractional structure that varies in a range of about −0.2 to 0.2, therefore the fractional structure can not employ into some applications such as the jitter specification is $\frac{1}{16}=0.0625$. Additionally, a dot line in FIG. 10 indicates the output jitter of the disclosed DCO circuit that is the same as the conventional tapped delay-line structure. Therefore the disclosed DCO circuit can generate the required output clock even the output clock has its frequency much closer to the fixed high frequency oscillator.

Many advantages offer by the disclosed DCO circuit. Firstly, excellent output jitter and a target clock having an average frequency coincides requirement can be obtained due to conventional tapped delay-line and fractional structures being together constructed in the invention. Secondly, a very simple structure of broadly used logic gates can establish the disclosed DCO circuit, the manufacture cost can thus be significantly degraded. Furthermore, no additional circuit such as the delay look-up circuits is required to adjust currently output clock even when the environment parameters have been changed.

As is understood by a person skilled in the art, the foregoing preferred embodiments of the present invention are illustrated of the present invention rather than limiting of the present invention. It is intended to cover various modifications and similar arrangements included within the spirit and scope of the appended claims, such as replacing the disclosed circuits by another logic gates, the scope of which should be accorded the broadest interpretation so as to encompass all such modifications and similar structure.

What is claimed is:

1. A digitally controlled oscillator of a digital phase lock loop, wherein said digitally controlled oscillator comprises:
   fractional clock generating means responsive to a reference clock for generating a target clock with a frequency;
   all-digital loop filtering means for outputting a filtering signal and input to said fractional clock generating means for changing the frequency of said target clock;
   output clock generating means having a plurality of cascade delay elements for generating an output clock of said digitally controlled oscillator, said cascade delay elements having a starting end;
   phase-frequency detecting means responsive to said target clock and said output clock for generating a comparison result;
   counting means responsive to said comparison result for changing a stored value of said counting means;
   controlling means responsive to said stored value of said counting means for generating a control signal that is routed into said output clock generating means to change a frequency of said output clock, said controlling means further comprises:
      cycle detecting means for generating a period ratio between a period of said reference clock and a delay interval of one of said cascade delay elements;
      number storing means for storing a selected number to indicate a selected delay element from said cascade delay elements, an output of said selected delay element being a next period of said output clock; and
      adding means responsive to said period ratio, said stored value of said counting means, said selected number, and said reference clock for generating a next selected number and an overflow signal, said overflow signal indicating whether said selected delay element is being selected from said starting end of said cascade delay elements.

2. The digitally controlled oscillator according to claim 1, wherein said cycle detecting means comprises:
   an increment counter responsive to said reference clock for increasing a stored value of said increment counter;
   selected number controlling means responsive to said stored value of said increment counter and said output clock for generating a candidate number; and
   period ratio storing means responsive to said reference clock and a pre-stored period ratio value for determining whether to store said candidate number in said period ratio storing means as a period ratio.

3. The digitally controlled oscillator according to claim 2, wherein said selected number controlling means comprises:
   logic operating means responsive to a logic OR result and said output clock for generating a candidate selecting signal, wherein said logic OR result is an logic OR operation of all output bits of said increment counter; and
   a candidate selecting multiplexer responsive to said candidate selecting signal for determining whether said stored value of said increment counter or current stored value of said period ratio storing means being said candidate number.

4. The digitally controlled oscillator according to claim 1, wherein said adding means comprises:
   delay element numbering means responsive to said stored value of said counting means and said period ratio for generating a number representative of said next selected delay element; and
   comparing means responsive to said period ratio and said number representative of said next selected delay element for generating said overflow signal.

5. The digitally controlled oscillator according to claim 1, wherein said comparison result comprises a carry signal and a borrow signal, said carry signal being generated to slow down said output clock when said output clock is faster than said target clock, said borrow signal being generated to speed up said output clock when said output clock is slower than said target clock.

6. The digitally controlled oscillator according to claim 5, wherein said increment counter responsive to said carry signal for increasing said stored value of said increment counter, said increment counter responsive to said borrow signal for decreasing said stored value of said increment counter.

7. The digitally controlled oscillator according to claim 6, wherein a slow-down signal is generated for slowing down said output clock when said stored value of said increment counter increases to a first threshold, a speed-up signal being generated for fastening said output clock when said stored value of said increment counter decreases to a second threshold.

8. The digitally controlled oscillator according to claim 7, wherein said first threshold is a positive number and said second threshold is a negative number, a absolute value of said first threshold being equal to a absolute value of said second threshold.

9. A digitally controlled oscillator of a digital phase lock loop, wherein said digitally controlled oscillator comprises:
   fractional clock generating means responsive to a reference clock for fractionally generating a target clock by using said reference clock;
   all-digital loop filtering means for outputting a filtering signal and input to said fractional clock generating means for changing the frequency of said target clock;
   output clock generating means having a plurality of cascade delay elements for generating an output clock of said digitally controlled oscillator, said cascade delay elements having a starting end;
   phase-frequency detecting means responsive to said target clock and said output clock for generating a first signal when said output clock is faster than said target clock, and for generating a second signal when said output clock is slower than said target clock;
   counting means responsive to said first signal for increasing a stored value of said counting means, said counting means generating a frequency-enlarging signal when said stored value of said counting means reaches a first threshold, said counting means responsive to said second signal for decreasing a stored value of said counting means, said counting means generating a frequency-fastening signal when said stored value of said counting means reaches a second threshold, said first threshold being a positive number and said second threshold being a negative number, an absolute value of said first threshold being equal to an absolute value of said second threshold; and
   controlling means responsive to said frequency-enlarging signal for controlling said output clock generating means to slow down said output clock, said controlling means responsive to said frequency-fastening signal for controlling said output clock generating means to speed up said output clock, said controlling means further comprises:
   cycle detecting means for generating a period ratio between a period of said reference clock and a delay interval of one of said cascade delay elements;
   number storing means for storing a selected number to indicate a selected delay element from said cascade delay elements, an output of said selected delay element being a next period of said output clock; and
   adding means responsive to said period ratio, said stored value of said counting means, said selected number, and said reference clock for generating a next selected number and an overflow signal, said overflow signal indicating whether said selected delay element is being selected from said starting end of said cascade delay elements.

10. The digitally controlled oscillator according to claim 9, wherein said cycle detecting means comprises:
    an increment counter responsive to said reference clock for increasing a stored value of said increment counter;
    selected number controlling means responsive to said stored value of said increment counter and said output clock for generating a candidate number; and
    period ratio storing means responsive to said reference clock and a pre-stored period ratio value for determining whether to store said candidate number in said period ratio storing means as a period ratio.

11. The digitally controlled oscillator according to claim 10, wherein said selected number controlling means comprises:
    logic operating means responsive to a logic OR result and said output clock for generating a candidate selecting signal, wherein said logic OR result is an logic OR operation of all output bits of said increment counter; and
    a candidate selecting multiplexer responsive to said candidate selecting signal for determining which one of said stored value of said increment counter or current stored value of said period ratio storing means being said candidate number.

12. The digitally controlled oscillator according to claim 9, wherein said adding means comprises:
    delay element numbering means responsive to said stored value of said counting means and said period ratio for generating a number representative of said next selected delay element; and
    comparing means responsive to said period ratio and said number representative of said next selected delay element for generating said overflow signal.

13. A method for generating an output clock of digitally controlled oscillator employed in a phase lock loop, wherein said method comprises the steps of:
    generating a target clock having a frequency by using fractional clock generating means;
    generating a filtering signal by using all-digital loop filtering means and input to said fractional clock generating means for changing the frequency of the said target clock;
    generating a phase-difference of said target clock and said output clock;
    increasing a phase-variation stored value when said phase-difference indicates that said output clock is faster than said target clock;
    decreasing said phase-difference stored value when said phase-difference indicates that said output clock is slower than said target clock;

slowing down said output clock when said phase-difference stored value reaches a first threshold; and fastening said output clock when said phase-difference stored value reaches a second threshold.

14. The method according to claim 13, wherein said method of slowing down said output clock comprises the steps of:

increasing a base number employed for selecting a delay element from a cascade tapped-delay line; and slowing down said output clock by using said phase-difference and said increased base number.

15. The method according to claim 14, wherein said method of fastening said output clock comprises the steps of:

decreasing said base number; and fastening said output clock by using said phase-difference and said decreased base number.

16. The method according to claim 13 wherein said target clock is generated by using a fractional structure employed as a digitally controlled oscillator of said phase lock loop.

* * * * *